United States Patent [19]

Schrepp et al.

[11] Patent Number: 5,288,697

[45] Date of Patent: Feb. 22, 1994

[54] PRODUCTION OF THIN PROTECTIVE POLYIMIDE LAYERS ON HIGH TEMPERATURE SUPERCONDUCTORS

[75] Inventors: Wolfgang Schrepp, Heidelberg; Hans-Joachim Haehnle, Ludwigshafen; Michael Grunze, Neckargemuend, all of Fed. Rep. of Germany

[73] Assignee: BASF Aktiengesellschaft, Ludwigshafen, Fed. Rep. of Germany

[21] Appl. No.: 879,012

[22] Filed: May 6, 1992

[30] Foreign Application Priority Data

May 15, 1991 [DE] Fed. Rep. of Germany ....... 4115872

[51] Int. Cl.$^5$ ........................... B05D 1/36; B05D 7/00
[52] U.S. Cl. ....................................... 505/1; 505/701; 505/702; 427/62; 427/407.1; 427/340; 427/385.5; 427/255.6; 427/430.1
[58] Field of Search ................... 505/1, 730, 701, 702; 427/62, 63, 407.1, 340, 385.5, 255.6, 430.1; 428/930

[56] References Cited

U.S. PATENT DOCUMENTS

| | | | |
|---|---|---|---|
| 4,759,958 | 7/1988 | Numata et al. | 427/255.6 |
| 4,877,653 | 10/1989 | Vora et al. | 427/385.5 |
| 4,942,142 | 7/1990 | Itozaki et al. | 505/1 |

FOREIGN PATENT DOCUMENTS

| | | |
|---|---|---|
| 0247358 | 12/1987 | European Pat. Off. |
| 0305168 | 3/1989 | European Pat. Off. |
| 60-145375 | 7/1985 | Japan |
| 63-318015 | 12/1988 | Japan |
| 1-246105 | 10/1989 | Japan |

OTHER PUBLICATIONS

S. Majumdar et al., "XPS Studies on Passivated and Degraded YBa$_2$Cu$_3$O$_{7-x}$ Films" Jan. 17, 1989, Physcia C., vol. 158, pp. 413–418.

S. Morohashi et al., "YBa$_2$Cu$_3$O$_x$ Thin Films Coated by Plasma Polymerization" (1989), Materials Science and Engineering, vol. A109, pp. 321-323.

R. P. Vasquez et al., "Wet chemical techniques for passivation of YBa$_2$Cu$_3$O$_{7-x}$" (1989), Appl. Phys. Lett., vol. 55, pp. 1801-1804.

E. Weschke et al., "Interface formation of Bi-based high-T$_c$ superconductors with Mg and Ag" (1989), Z. Phys. B-Condensed Matter vol. 74, pp. 191-195.

M. Grunze et al., "Adhesion of Vapout Phase Deposited Ultra-thin Polyimide Films on Polycrystalline Silver" (1988) Surface Science, vol. 204, pp. 183-212.

J. R. Salem et al., "Solventless polyimide films by vapor deposition" (May–Jun. 1986) J. Vac. Sci. Technol., vol. A4, pp. 369-374.

M. C. Petty, "Molecular Engineering using the Langmuir-Blodgett Technique" (1987) Polymer Surfaces and Interfaces, pp. 163-187.

R. Maoz et al., "Penetration Controlled Reactions in Organized . . . " (1985) Thin Solid Films, pp. 135-151.

Phys. Bl. 43 (1987) Nr. 4, p. 96.

Phys. Bl. 43 (1987) Nr. 9, pp. 357-363.

Phys. B. 46 (1990) Nr. 11, pp. 419-425.

Embs et al., "Preformed Polymers for Langmuir-Blodgett Films—Molecular Concepts" (1991) Adv. Mater. No. 1, pp. 25-31.

*Primary Examiner*—Roy King
*Attorney, Agent, or Firm*—Keil & Weinkauf

[57] ABSTRACT

Thin protective polyimide layers are produced on ceramic or high temperature superconductors by applying polyimide solutions, polyamic acids or starting substances therefor to the superconductor surface and imidating or drying in an oxygen atmosphere.

5 Claims, No Drawings

PRODUCTION OF THIN PROTECTIVE POLYIMIDE LAYERS ON HIGH TEMPERATURE SUPERCONDUCTORS

BACKGROUND OF THE INVENTION

1. Field of the Invention

The present invention relates to a process for producing thin protective polyimide layers on ceramic or high temperature superconductors, in which either the polyamic acids from which the polyimide will be derived, or starting substances for the acids, are applied to the superconductor surfaces and imidated, or polyimide solutions are applied to the superconductor surface and dried at elevated temperature.

2. Description of the Prior Art

It is know that high temperature superconductors exposed to ambient influences such as air, moisture, thermal and mechanical stress, etc., show signs of degradation (cf. D. Majundar, D. Chatterjee, G. Pav.-Pujalt: Physica C, 158(3) (1989)) which manifest themselves in a lowering of the critical temperature. A possible cause is the elimination of oxygen (for example in the case of $YBa_2Cu_3O_{7-x}$).

It would therefore be desirable to have a process whereby dielectric polymer layers can be applied to the surface of high temperature superconductors for passivation and electrical insulation in order to protect the superconductor from ambient influences while preserving the superconducting properties. Electrical insulation with the aid of dielectric layers permits the use of superconductor parts (for example in magnets and components of electric motors) and of superconductor layers in electronic devices.

Various passivating processes have been described, for example the application of carbon layers by magnetron sputtering in JP 60 145 375 A2 and JP 01 246 105 A2. S. Morohashi, H. Tamura, A. Yoshida and S. Hasuo in Mater. Sci. Eng. A 109 (1989), 321, also describe protection by means of plasma polymerization. Coating with organic resin layers (fluoropolymers, epoxy resins, siloxanes) is described in EP 305 168 A2 and the use of polyimides in JP 63 318 015 A2. A likewise frequently employed method of preventing damaging oxygen elimination is the introduction of polymeric (for example ethylcellulose) or wet chemical materials (for example oxalates) during the making of the ceramic (cf. R. P. Vasquez, M. C. Foote, B. D. Hunt; Appl. Phys. Lett., 55 (1989) 1801). Inorganic protective layers such as noble metals, transition metals, $SiO_2$, $Si_3N_4$ and AlN are described by E. Weschke, C. Laubschat, M. Domke, M. Bodenbach, G. Kaindle, J. E. Ortega and M. Mirand in Z. Phys. B: Condens. Matter, 74 (2) (1989) 191.

The preparation of organic protective layers using vapor deposition techniques is described by R. N. Lamb and M. Grunze in Surf. Sci., 204 (1988) 183 and by J. R. Salem, F. O. Sequeda, J. Duran, W. J. Lee, R. M. Yang in J. Vac. Sci., Technol., A4 (3) (1986) 369.

The preparation of organic protective layers by the Langmuir-Blodgett or Langmuir-Schäfer technique is described by M. C. Petty in W. J. Feast and H. S. Munro (Editors) in Polymer Surfaces and Interfaces, J. Willey & Sons, Chichester 1987, pp. 163, and the self-assembly r technique by R. Maoz and J. Sagiv in Thin Solid Films 132 (1985) 135. The application of suitably modified polymethacrylates, polyamides, polyurethanes and polyesters by the Langmuir-Blodgett technique is also discernible from the paper by F. Embs, D. Funhoff, A. Laschewsky, U. Licht, H. Ohst, W. Prass, H. Ringsdorf, G. Wegner and R. Wehrmann in Adv. Mater., 3 (1991) 25. As revealed by EP 02 47 358 A2, polyamic acids can be deposited on the substrate also by the Langmuir-Blodgett or Langmuir-Schäfer technique.

Any imidation of polyamic acid layers on high temperature superconductors under a protective gas atmosphere or under reduced pressure, whether the layers are being applied from solution, from the vapor phase or by the Langmuir-Blodgett technique, causes degradation of the polymer, owing to diffusion of lattice oxygen out of the ceramic superconductor, and ultimately the loss of the superconducting properties.

It is an object of the present invention to delineate a process whereby these disadvantages are avoided.

SUMMARY OF THE INVENTION

We have found, surprisingly, that this object is achieved, i.e. that polyamic acids are readily converted into polyimide or polyimide solutions applied to the superconductor are readily dried and the diffusion of lattice oxygen out of the ceramic superconductor is suppressed, when the imidation or drying takes place in an oxidizing atmosphere, preferably in an oxygen atmosphere. The success of this measure is detectable in the XPS spectrum.

The present invention accordingly provides a process for producing a thin protective polyimide layer on a ceramic or high temperature superconductor, in which the polyamic acid from which the polyimide will be derived, or starting substances for the acid, are applied to the superconductor surface and imidated, which comprises carrying out the imidation in an oxidizing atmosphere, preferably in an oxygen atmosphere.

In this process, the polyamic acid to be converted into polyimide may be applied to the superconductor surface by the Langmuir-Blodgett or Langmuir-Schäfer technique, or the starting substances for forming the polyamic acid from which the polyimide is to be formed can be applied to the (high temperature) superconductor surface from the vapor phase.

The present invention also provides a process for producing a thin protective polyimide layer on a ceramic or high temperature superconductor, in which a polyimide solution is applied to the superconductor, which comprises drying at elevated temperature in an oxidizing atmosphere, preferably in an oxygen atmosphere.

Here the polyimide solution may be applied to the superconductor surface by spin coating. Instead of a ceramic or high temperature superconductor it is also possible for other inorganic oxidic materials to be provided with thin protective polyimide layers by the process according to the invention.

The process according to the invention will now be described more particularly.

The preparation of the polyamic acids corresponding to the various polyimides is known. In general, they are obtained by reacting equimolar amounts of tetracarboxylic anhydrides with diamino compounds.

The preferred tetracarboxylic dianhydrides are pyromellitic dianhydride and benzophenonetetracarboxylic dianhydride. Examples of further tetracarboxylic dianhydrides are 2,3,9,10-perylenetetracarboxylic dianhydride, 1,4,5,8-naphthalenetetracarboxylic dianhydride, 2,6-dichloronaphthalene-1,4,5,8-tetracarboxylic dianhydride, 2,7-dichloronaphthalene-1,4,5,8-tetracarboxylic dianhydride, phenanthrene-1,8,9,10-tetracarboxylic dianhydride, 3,3',4,4'-biphenyltetracarboxylic dianhydride, 2,2',3,3'-biphenyltetracarboxylic dianhydride, 4,4'-isopropylidenediphthalicanhydride,3,3'-isopropylidenediphthalic anhydride, 4,4'-oxydiphthalic anhydride, 4,4'-sulfonyldiphthalic anhydride, 3,3'-oxydiphthalic anhydride, 4,4'-methylenediphthalic anhydride, 4,4'-thiodiphthalic anhydride, 4,4'-acetylidenediphthalic anhydride, 2,3,6,7-naphthalenetetracarboxylic dianhydride, 1,2,4,5-naphthalenetetracarboxylic dianhydride, 1,2,5,6-naphthalenetetracarboxylic dianhydride, benzene-1,2,3,4-tetracarboxylic dianhydride, thiophene-2,3,4,5-tetracarboxylic dianhydride, 1-(3',4'-dicarboxyphenyl)-1,3,3-trimethylindane-5,6-dicarboxylic dianhydride, 1-(3',4'-dicarboxyphenyl)-1,3,3-trimethylindane-6,7-dicarboxylic dianhydride, 1-(3',4'-dicarboxyphenyl)-3-methylindane-5,6-dicarboxylic dianhydride, 1-(3',4'-dicarboxyphenyl)-3-methylindane-6,7-dicarboxylic dianhydride, 3,3',4,4'-benzophenonetetracarboxylic anhydride, 4,5,3',4'-benzophenonetetracarboxylic anhydride.

As diamino compounds it is possible to use any customary aromatic diamino compound, but preference is given to 4,4'-diaminodiphenyl ether (=4,4'-oxydianiline). In place of or mixed with 4,4'-diaminodiphenyl ether it is also possible, for example, to use other diamines, e.g. 4,4-methylenebis(o-chloroaniline), 3,3'-dichlorobenzidine, 3,3'-sulfonyldianiline, 4,4'-diaminobenzophenone, 1,5-diaminonaphthalene, bis(4-aminophenyl)dimethylsilane, bis(4-aminophenyl)diethylsilane, bis(4-aminophenyl)diphenylsilane, bis(4-aminophenyloxy)dimethylsilane, bis(4-aminophenyl)ethylphosphine oxide, N-(bis(4-aminophenyl))-N-methylamine, N-(bis(4-aminophenyl))-N-phenylamine, 4,4'-methylbis(3-methylaniline), 4,4'-methylenebis(2-ethylaniline), 4,4'-methylenebis(2-methoxyaniline), 5,5'-methylenebis(2-aminophenol), 4,4'-methylenebis(2-methylaniline), 5,5'-oxybis(2-aminophenol), 4,4'-thiobis(2-methylaniline), 4,4'-thiobis(2-methoxyaniline), 4,4'-thiobis(2-chloroaniline), 4,4'-sulfonylbis(2-ethoxyaniline), 4,4'-sulfonylbis (2-chloroaniline), 5,5'-sulfonylbis(2-aminophenol), 3,3'-dimethyl-4,4'-diaminobenzophenone, 3,3'-dimethoxy-4,4'-diaminobenzophenone, 3,3'-dichloro-4,4'-diaminobenzophenone, 4,4'-diaminobiphenyl, m-phenylenediamine, p-phenylenediamine, 4,4'-methylenedianiline, 4,4'-thiodianiline, 4,4'-sulfonyldianiline, 4,4'-isopropylidenedianiline, 3,3'-dimethylbenzidine, 3,3'-dimethoxybenzidine, 3,3'-dicarboxybenzidine, diaminotoluene.

Polyimides which are soluble in organic strongly polar solvents, such as phenol, cresol, dimethylformamide, dimethylacetamide or in particular N-methylpyrrolidone, are in general those which are formed from appropriately sterically hindered aromatic diamine or tetracarboxylic acid dianhydride components, for example from alkyl-, aryl- or alkylaryl-substituted aromatic diamines or 4,4'-isopropylidenedianiline where the hydrogen atoms of the isopropylidene group have been replaced by fluorine atoms, and 4,4'-isopropylidenediphthalic anhydride where the hydrogen atoms of the isopropylidene group have been replaced by fluorine atoms, or benzophenonetetracarboxylic dianhydride with sterically hindered aromatic diamino compounds. Examples of such soluble polyimides are indicated by the following formulae (repeat units):

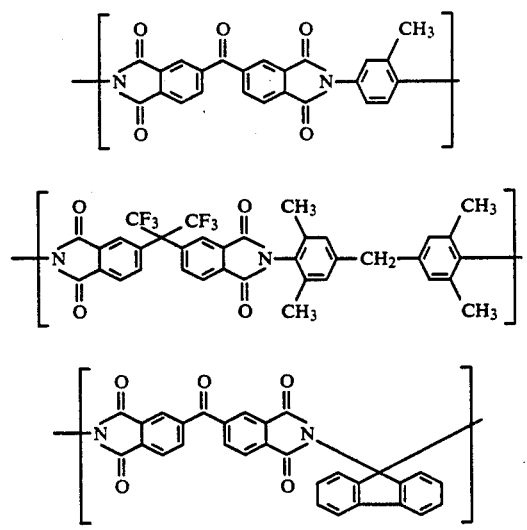

It is possible to apply the solution of a polyamic acid parent of an appropriate polyimide in for example N-methylpyrrolidone to the ceramic substrate (for example a ceramic superconductor) in a conventional manner by spin coating and evaporate off the solvent at about 100°-150° C.

According to the present invention, this is then followed by imidation in an oxidizing atmosphere at 150° C.-400° C. with elimination of water. As an alternative to applying polyamic acid solutions to ceramic superconductors the polyamic acid can be applied to the surface of the ceramic superconductor by gas phase deposition of its formative diamine and tetracarboxylic dianhydride components or by the Langmuir-Blodgett or Langmuir-Schäfer technique by repeated transfer from the water surface of a Langmuir trough of spread-out monomolecular layers of long-chain ammonium salts of the polyamic acid (in general from 6 to 50, preferably from 10 to 30, layers) and then imidated according to the present invention in an oxidizing atmosphere. Imidation in the additional presence of dehydrating agents, for example acetic anhydride in pyridine, is likewise possible.

The abovementioned sterically hindered polyimides which are still soluble in polar organic solvents, such as N-methylpyrrolidone, can be applied directly to the ceramic superconductor in the form of their solutions by spin coating. After the bulk of the solvent has been removed at around 100° C., the imide film is dried according to the present invention in an oxidizing atmosphere at above 150° C. Spin coating generally produces film thicknesses of from 500 to 1000 nm, but thicker films are also possible.

The process according to the present invention is suitable for producing thin protective polyimide layers on all possible inorganic oxidic materials, for example on surface oxidized silicon wafers and CMOS structures, in particular for protective polyimide layers on ceramic or high temperature superconductors, as revealed for example together with their composition in the papers in Phys. Bl. 43 (1987) No. 4, 96, Phys. Bl. 43 (1987) No. 9, 357–363 and Phys. Bl. 46 (1990) No. 11, 419–425. As examples of such high temperature superconductors there may be mentioned $YBa_2Cu_3O_7$, $YBa_2Cu_3O_{7-x}$ and also $(La,M)_2CuO_4$ where $M=Ca$, Sr or Ba, which can be prepared for example as porous sintered structures or as films on, for example, aluminum oxide or strontium titanate substrates by sputtering or laser deposition.

For the purposes of the present invention an oxidizing atmosphere is oxygen, an oxygen-air mixture, nitrous oxides $NO_x$ and also $N_2O_2$. Preference is given to pure oxygen; as oxidizing atmosphere for the imidation or drying it is employed at a pressure of from 1 to 5 atmospheres, for example over a period of about 1-5 hours.

Using the process according to the present invention it is possible to apply dielectric polyimide layers to high temperature superconductor surfaces for the purposes of passivation and electric insulation. Passivation protects the superconductor from ambient influences in order to preserve the superconducting properties. Electrical insulation with dielectric polyimide layers permits the use of superconductor parts, for example, in magnets and components of electric motors and of superconductor layers in electronic devices.

Proof that imidation in an oxidizing atmosphere presents no problems and that lattice oxygen does not diffuse out of the ceramic superconductor is provided by the XPS spectrum. An XPS spectrum, X-ray induced photoelectron spectrum, measures the bond energies and the characteristic band shape of the C1s, O1s and N1s of the polyimide and the stoichiometric ratio for a polyimide of $C:O:N=22:5:2$ (for the polyimide based on pyromellitic dianhydride and 4,4'-oxydianiline).

If a Langmuir-Blodgett application to a ceramic superconductor of a film of the octadecylammonium salt of the polyamic acid formed from pyromellitic dianhydride and 4,4'-oxydianiline or the direct gas phase deposition to the ceramic superconductor of an equimolar mixture of pyromellitic dianhydride and oxydianiline is followed by the imidation in an oxidizing atmosphere at from 200° to 350° C., preferably at from 250° to 300° C., the XPS measurements indicate that a normal intact polymer film having the desired dielectric properties is obtained.

The invention will now be more particularly described by way of example. Parts and percentages are by weight, unless otherwise stated.

DESCRIPTION OF THE PREFERRED EMBODIMENTS

Example 1

Application of passivating layers by the Langmuir-Blodgett technique

A solution of the long-chain ammonium salt of a polyamidocarboxylic acid of the formula The solvent used is a mixture of one part N-methylpyrrolidone (=NMP) and nine parts chloroform. The concentration is about 1 mg per ml of solvent. After the chloroform has been evaporated, the surface film is compressed to a surface pressure of 25 mN/m. The subphase is Milli-Q purified water of 18 MOhm cm and about pH 5.6. The subphase temperature is 15° C. The superconductor to be coated (yttrium-barium-copper oxide film on aluminum oxide or strontium titanate) is immersed and withdrawn with the aid of the film lift FL1 from Lauda at a speed of 4 mm/min. In general, two monomolecular layers are transferred per immersion cycle and in total 20 layers are applied to the superconductor surface. The imidation is carried out in a heated flow reactor in a static oxygen atmosphere at up to a pressure of 2 atmospheres of $O_2$. The samples were transferred into the reaction chamber and then heated in 50° C. increments, each temperature level being kept constant for 15 min, to 350° C. After each heat treatment the film was examined by means of the abovementioned X-ray induced photoelectron spectroscopic technique in respect of its elemental composition and stoichiometry. The results showed that the imidation in an oxygen atmosphere leads to stoichiometric polyimide films on high temperature superconductors—without loss of the superconducting properties—and also on other inorganic oxidic substrates.

EXAMPLE 2

Application of passivating layers by gas phase deposition of 1,2,4,5-benzenetetracarboxylic dianhydride and 4,4'-oxydianiline The coating of the high temperature superconductor surface ($YBa_2Cu_3O_{7-x}$ film on aluminum oxide) was carried out in a vacuum system equipped with two calibrated vaporizer sources for the dianhydride and the diamine. The high temperature superconductor surface is located at a point where approximately equal deposition films of the starting compounds can be obtained. The substrate surface is at room temperature, while sublimation of the dianhydride and the diamine out of the vaporizer cell takes place at $T \geq 100°$ C. By adjusting the temperature of the vaporizer cell it is possible to set deposition rates (determined with an oscillating quartz) of from a few angstrom per minute to several nanometers per second, so that it is possible to produce polyamic acid films from a few angstrom to several millimeters in thickness, since the dianhydride and the diamine react spontaneously in the adsorbate phase to form the polyamic acid.

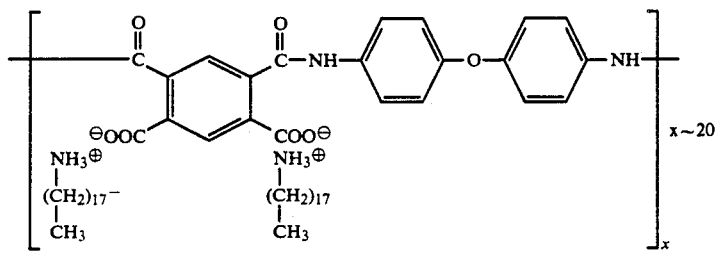

is spread out on the water surface of a Langmuir trough (FW1 or FW2 from Lauda, Königshofen).

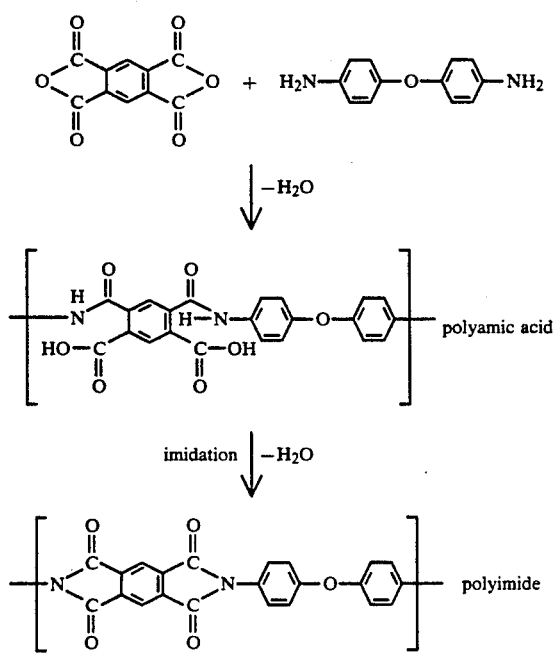

Imidation of Polyamic Acid

The imidation of the deposited polyamic acid films was carried out in a heated flow reactor and in a static oxygen atmosphere at up to a pressure of 2 atmospheres of $O_2$. The samples were transferred into the reaction chamber and then heated in 50° C. increments, each temperature level being kept constant for 15 min, to 350° C. After each heat treatment the film was examined by means of X-ray induced photoelectron spectroscopy in respect of its elemental composition and stoichiometry.

The results showed that the imidation in an oxygen atmosphere leads to stoichiometric polyimide films on high temperature superconductors—without loss of the superconducting properties—and also on other inorganic substrates and that homogeneous films can thus be produced.

EXAMPLE 3

Application of passivating layers to high temperature superconductors by spin coating N-Methylpyrrolidone solutions of polyimides composed respectively of the following repeat units:

are applied to superconductor surfaces ($YBa_2Cu_3O_{7-x}$) by spin coating and predried at from 100° to 150° C. to produce films from 500 to 1000 nm in thickness. The time for drying the films in an oxygen atmosphere may be shortened here to less than 60 min if temperatures of 250°–350° C. are employed.

We claim:

1. A process for producing a protective layer of a polyimide on a substrate of a high temperature superconductor material which comprises: (1) applying a layer of a) a polyamic acid which serves as a precursor to polyimide or b) a precursor of the polyamic acid to the substrate and (2) imidating the applied layer in an atmosphere consisting essentially of oxygen.

2. The process of claim 1, wherein the polyamic acid is applied to the substrate by the Langmuir-Blodgett or Langmuir-Schäfer technique.

3. The process of claim 1, wherein the precursor of the polyamic acid is applied to the substrate from the vapor phase.

4. A processing for producing a protective layer of a polyimide on a substrate of a high temperature superconductor material which comprises: applying a solution of the polyimide to the substrate and drying the solution at an elevated temperature in an atmosphere consisting essentially of oxygen.

5. The process of claim 4, wherein the polyimide solution is applied to the substrate by spin-coating.

* * * * *